United States Patent [19]

Hunt et al.

[11] Patent Number: 5,449,640
[45] Date of Patent: Sep. 12, 1995

[54] FABRICATING ELECTRICAL CONTACTS IN SEMICONDUCTOR DEVICES

[75] Inventors: Paul A. Hunt; Ian M. Liles, both of Newport; David R. Guite, Cardiff, all of United Kingdom

[73] Assignee: INMOS Limited, Bristol, England

[21] Appl. No.: 732,601

[22] Filed: Jul. 19, 1991

Related U.S. Application Data

[63] Continuation of Ser. No. 502,836, Mar. 30, 1990, abandoned.

[30] Foreign Application Priority Data

Jun. 13, 1989 [GB] United Kingdom ............... 8913540

[51] Int. Cl.⁶ ........................................ H01L 21/443
[52] U.S. Cl. ................... 437/190; 437/982; 437/192; 437/194; 437/195
[58] Field of Search ............... 437/190, 192, 194, 982; 148/DIG. 100

[56] References Cited

U.S. PATENT DOCUMENTS

| | | | |
|---|---|---|---|
| 4,271,424 | 6/1981 | Inayoshi et al. | 357/67 |
| 4,784,973 | 11/1988 | Stevens et al. | 437/190 |

FOREIGN PATENT DOCUMENTS

| | | |
|---|---|---|
| 0186296 | 7/1986 | European Pat. Off. . |
| 0273629 | 6/1988 | European Pat. Off. . |
| 2825433 | 12/1978 | Germany . |
| 62-022437 | 1/1987 | Japan . |

OTHER PUBLICATIONS

W. Kern et al., "Deposition Processes for BPSG Films," *Ext. Abs of the Electrochem. Soc. Meeting,* Fall 1988, Abstract #238, p. 333.

S. Wolf, *Silicon Processing for the VLSI Era,* vol. 2, Lattice Press, Sunset Beach, Calif., 1990, pp. 104, 105, 173.

S. Wolf et al., *Silicon Processing for the VLSI Era,* Lattice Press, Sunset Beach (1986) pp. 187–191.

C. Y. Ting, "Using TiN and Si₃N₄ for VLSI Contacts", *IBM Technical Disclosure Bulletin,* Sep. 1981, New York pp. 1976–1977.

Cohen et al., "Rapid Thermal Processing of TiN and TiSi₂ Films for VLSI Applications", Extended Abstracts/Spring Meeting, May 15–20, 1988, Princeton, New York, USA.

*Primary Examiner*—Brian E. Hearn
*Assistant Examiner*—Leon Radomsky
*Attorney, Agent, or Firm*—Willian Brinks Hofer Gilson & Lione

[57] ABSTRACT

A method of fabricating an electrical contact in a semiconductor device comprises providing on an underlying silicon substrate a reflowable interlevel dielectric material having a contact opening exposing a contact region of the silicon substrate. The silicon substrate and the interlevel dielectric material are heated by a rapid thermal anneal in an oxygen-containing atmosphere thereby to grow an oxide control layer in the contact region and to reflow the dielectric material. A layer of transition metal is deposited over the reflowed dielectric material and the control layer and at least part of the transition metal layer is converted into a metallurgic barrier.

12 Claims, 1 Drawing Sheet

FABRICATING ELECTRICAL CONTACTS IN SEMICONDUCTOR DEVICES

This is a continuation of application Ser. No. 05/502,836, filed Mar. 30, 1990, now abandoned.

BACKGROUND OF THE INVENTION

The present invention relates to a method of fabricating an electrical contact in a semiconductor device.

In the fabrication of integrated circuits, silicon is commonly used in its monocrystalline form as a substrate and in its polycrystalline form for gate electrodes and interconnects. Aluminium and aluminium alloys are commonly used as a conductor and especially for forming contacts for interconnects. One problem of using aluminium and aluminium alloys is that silicon is soluble in or diffuses into aluminium. Thus, when a contact is formed by opening a contact window to, for example, a source or drain region formed in a silicon substrate and aluminium is used to fill the contact opening, some of the silicon disolves, resulting in what is generally called a "spike" which extends downwardly from the contact. If the spike goes all the way through the source/drain region or other underlying region, then the transistor will be ruined by a "spiked junction". The spike also results in a localised region of increased current density at the contact which can cause device failure.

To prevent this, titanium nitride can be used as a metallurgic barrier against the reaction between the silicon substrate and the aluminium contact material. Thus, when the aluminium is separated from the silicon by a titanium nitride layer, spiking is reduced or stopped entirely. It is possible to form titanium nitride by reacting pure titanium with nitrogen but it is difficult nevertheless to obtain a good barrier quality. First, one desires a barrier layer which is not too thin and second the barrier layer formed of titanium nitride should have trace amounts of impurity. It is believed that impurities such as oxygen incorporated in the barrier improve the barrier quality by inhibiting diffusion of silicon atoms through the barrier along the titanium nitride grain boundaries. Also, the barrier layer should not be in a state of tensile stress, as a stressed layer is believed to be less effective in preventing diffusion of silicon and so lower tensile or compressive stress is preferred.

U.S. Pat. No. 4,784,973 discloses that when titanium nitride is used as a diffusion barrier material, the performance of the titanium nitride as a metallurgic barrier can be enhanced by growing a thin oxide layer in the contact region prior to forming titanium nitride. The presence of a thin oxide between the silicon and the titanium during thermal nitridation reduces the rate of titanium silicide formation without affecting the rate of nitride formation and the net effect is to produce more titanium nitride and less $TiSi_x$ for the same thickness of sputtered titanium. The consumption of the oxide during nitridation leads to some silicide formation and consequently low contact resistance and the consumed oxide will effectively "stuff" the titanium nitride diffusion barrier improving the barrier properties. Conventional processes use a furnace tube operation to grow this thin diffusion barrier oxide and such an operation is disclosed in U.S. Pat. No. 4,784,973 although that specification does also disclose that the thin diffusion barrier oxide can be grown in a rapid thermal processor.

The process disclosed in U.S. Pat. No. 4,784,973 suffers from the disadvantage that it is difficult to control the formation of the thin diffusion oxide layer resulting in variability not only in the thickness of the diffusion oxide layer but also in the cleanliness thereof, leading to a reduction in device reliability. Furthermore, device reliability can also be, reduced as a result of poor step cover and this can lead to the spiking phenomenon referred to above. The process also results in contacts having relatively high contact resistance.

Various Al alloys are used as interconnect materials for VLSI devices due to the low resistivity of the Al alloys and compatibility with conventional photolithographic techniques. For devices using more than one interconnect layer (i.e. in multilevel metallization) it is advantageous to use a "capped" Al alloy in which a mechanically strong cap material is deposited over the Al alloy which reduces the growth of hillocks (being vertical extrusions extending upwardly from the metal Al surface) during heat cycles after metal deposition. Hillocks are formed to relieve a large amount of compressive stress in the aluminum layer caused by the difference in thermal expansivity between the metal layer and the silicon substrate. The presence of a hillock can result in an unwanted connection or bridge between two layers of interconnect. A thin (around 500 Angstroms thick) layer of titanium has been shown to be effective in reducing the number and size of hillocks to an acceptable level for multilevel metallization applications. However, it has also been noted that the titanium cap reacts with the aluminium and the silicon to form a ternary compound ($Al_xSi_yTi_z$) which has a large affinity for silicon and the formation of this compound will leave a silicon doped aluminium alloy deficient of silicon.

SUMMARY OF THE INVENTION

The present invention aims to mitigate these disadvantages of the process known from U.S. Pat. No. 4,784,973.

The present invention also aims to provide a process for fabricating an electrical contact which also enables effective and reliable use of a capping layer of, for example, titanium.

The present invention accordingly provides a method of fabricating an electrical contact in a semiconductor device, the method comprising the steps of:

(a) providing on an underlying silicon substrate a reflowable interlevel dielectric material having a contact opening exposing a contact region of the silicon substrate;

(b) heating the silicon substrate and the interlevel dielectric material by a rapid thermal anneal in an oxygen-containing atmosphere thereby to grow an oxide control layer in the contact region and to reflow the dielectric material;

(c) depositing a layer of a transition metal over the reflowed dielectric material and the control layer; and (d) converting at least part of the transition metal layer into a metallurgic barrier.

BRIEF DESCRIPTION OF THE DRAWINGS

An embodiment of the present invention will now be described by way of example only with reference to the accompanying drawings in which.

DETAILED DESCRIPTION OF THE PREFERRED EMBODIMENTS

Figure 1:
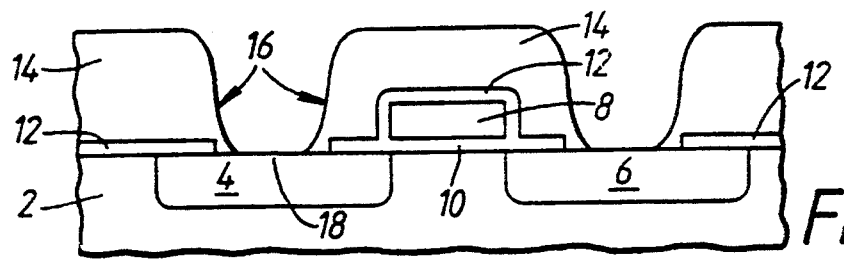
FIG. 1 shows a section through a silicon wafer structure having an underlying silicon substrate carrying an interlevel dielectric material which has contact openings exposing contact regions of the silicon substrate, the silicon wafer structure having source and drain regions and a gate electrode.

Referring to FIG. 1, a silicon substrate includes source and drain regions 4,6 formed therein. The source and drain regions 4,6 typically have depths of 0.1 to 0.5 micrometers and are formed generally by ion implantation or diffusion. A gate electrode is centered generally between the source and drain regions 4,6 and is separated from the upper surface of the silicon substrate 2 by a gate dielectric 10. The gate dielectric 10 is typically silicon oxide, silicon nitride or silicon oxynitride having a thickness of from 100 to 400 Angstroms. A layer 12 of silicon oxide, having a thickness typically in the range of from 200 to 1,000 Angstroms, covers the top and side walls of the gate electrode 8 and the upper surface of the silicon substrate 2. The source and drain regions 4,6 have been implanted in a known manner prior to opening the contact openings described hereinbelow and directly through the silicon oxide layer 12. After the ion implantation, there is a thermal anneal to activate the implanted ions and to drive them laterally and downwardly.

Thereafter, a relatively thick dielectric layer 14 of reflowable material is established, typically by chemical vapour deposition ("CVD"). The reflowable material is a doped SiO$_2$ glass, typically a boron phosphorous silicon glass (BPSG) such as a 3 weight percent boron, 5 weight percent phosphorous BPSG glass. The choice of the reflowable dielectric material for the interlevel dielectric layer 14 is restricted to those dielectric materials which have a compatible glass transition temperature such that the materials will flow at the subsequent required processing temperatures, these being discussed hereinbelow. Typically, the interlevel dielectric layer 14 has a thickness of from 0.5 to 1 micrometers. The interlevel dielectric layer 14 has contact openings 16 etched therethrough. The contact openings 16 extend entirely through the dielectric layer 14 and the underlying silicon oxide region 12 thereby to expose a contact region 18 of the source and drain regions 4,6 so that electric contact can be made thereto. The polysilicon gate electrode 8 remains covered by the silicon oxide layer 12 and the dielectric layer 14. The structure of FIG. 1 is ready for processing in accordance with the present invention. It should be noted however that the present invention is not confined to forming contacts to source and drain regions only and that contacts to other portions of integrated semiconductor circuits can be made in accordance with the present invention.

Figure 2:
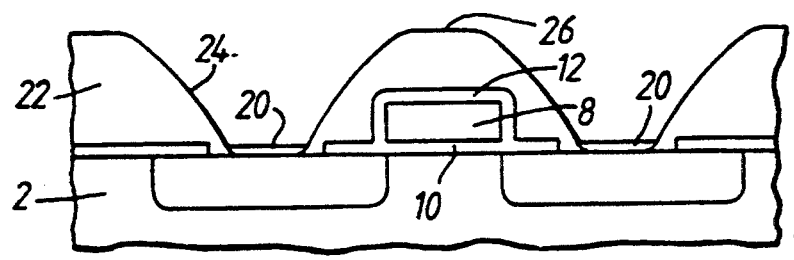
FIG. 2 shows the structure of FIG. 1 after growth of an oxide control layer in the contact regions and reflow of the dielectric material.

Referring to FIG. 2, the contact openings 16 and the contact regions 18 are pre-cleaned in an acid processor using sulphuric acid/hydrogen peroxide; dilute hydrofluoric acid; ammonium hydroxide/hydrogen peroxide or hydrochloric acid. It is believed that this precleaning step assists the subsequent formation of a uniform oxide layer in the contact regions 18.

The silicon wafer structure is then subjected to a rapid thermal anneal in a rapid thermal processor. The rapid thermal anneal is carried out in an oxygen-containing atmosphere. This causes an oxide control layer 20 to grow in the contact regions 18. Typically, the thickness of the oxide control layer 20 is from 20 to 50 Angstroms, and preferably 20 to 30 Angstroms. The rapid thermal anneal simultaneously causes reflow of the dielectric material so as to produce a smooth, rounded profile of the dielectric material 14 thereby to optimise the contact profile for subsequent deposition of layers in the contact openings 16. As will be clear from FIG. 2, after reflow the reflowed dielectric layer 22 has contact openings 24 which are considerably wider at the upper surface 26 of the reflowed dielectric layer 22 than at the oxide control layer 20.

Typically, the rapid thermal anneal is carried out at a temperature of from 800° to 1100° C., more preferably from 950°–1050° C. for a period of from 5 seconds to 5 minutes, more preferably from 5 to 120 seconds. The temperature depends upon the reflowable material present since the temperature must be sufficiently high to cause fellow, typically greater than about 800° C. For example, the rapid thermal anneal may be carried out for 60 seconds at a temperature of 1025° C. The gas flows and the temperature may be varied during the rapid thermal anneal—for example, the temperature may be low initially, at which oxidation but no reflow occurs and then high subsequently at which reflow and a greater degree of oxidation occur simultaneously.

Referrring to FIG. 3, a layer 28 of a transition metal is subsequently deposited over the reflow dielectric material 22 and the control layers 20. In the illustrated embodiment, the layer 28 comprises titanium and is deposited by, for example, sputtering or electron beam evaporation under high vacuum conditions. Typically, the layer 28 has a thickness of from 200 to 2,000 Angstroms, preferably around 700 Angstroms.

Figure 3:
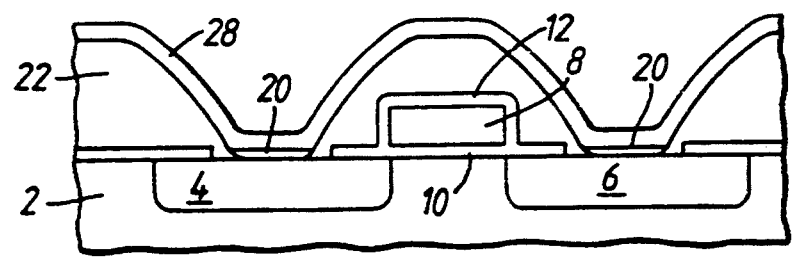
FIG. 3 shows the structure of FIG. 2 after deposition of a layer of a transition metal over the reflowed dielectric material and the control layer.
Figure 4:
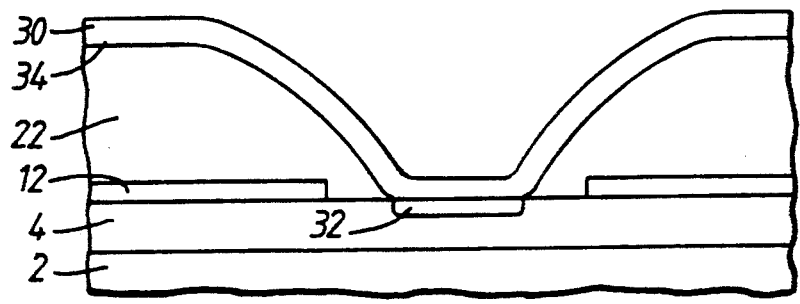
FIG. 4 is an enlarged view of the structure of FIG. 3 after conversion of the transition metal layer into a metallurgic barrier.

FIG. 4 shows an enlarged view of the structure of FIG. 3 after conversion of at least part of the titanium layer 28 into a metallurgic barrier. In the preferred embodiment, the substrate is subjected to a rapid thermal anneal in a nitrogen—or ammonium—containing atmosphere. This converts substantially all of the titanium to titanium nitride. Typically, the rapid thermal anneal is carried out in nitrogen at a temperature of around 700° to 800° C. for about 1 minute in the rapid thermal processor. Alternatively, the rapid thermal anneal may be carried out in ammonia at a temperature of from about 450° to 600° C. for about 30 seconds to 5 minutes. During this heating cycle, additionally the oxide control layers 20 on the source and drain regions 4,6 are converted into regions 32 which extend downwardly from the top surface of the source and drain region 4,6. The region 32 is primarily titanium silicide but traces of oxygen and nitrogen may be incorporated within the region 32. In general, the composition of region 32 may be described by the general formula Ti$_x$O$_y$N$_z$Si$_r$. The region 32 forms a low resistance electrical contact to the transistor source and drain regions 4,6. The region 32 is located only within the contact region 18 and typically has a thickness of around 600 Angstroms. The titanium nitride layer 30 which constitutes the metallurgic barrier primarily comprises titanium nitride. However, oxygen is preferably incorporated in the layer 30 to promote its function as a metallurgic barrier. It is believed that oxygen is incoporated along the grain boundaries within the titanium nitride layer 30 to prevent rapid diffusion of materials along the grain boundaries. In the lower portion 34 of the titanium nitride layer 30, the titanium nitride may include small amounts of silicon and oxygen therein which have been incorporated into the layer from the interlevel dielectric layer 22.

Figure 5:
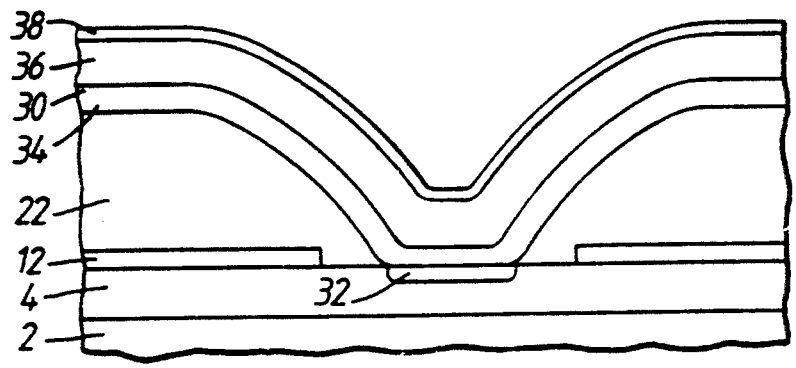
FIG. 5 shows the structure of FIG. 4 after successive deposition of an aluminium interconnect layer and a titanium capping layer over the metallurgic barrier.

FIG. 5 shows the structure of FIG. 4 after the deposition of an aluminium or aluminium alloy interconnect layer 36 over the titanium nitride layer 30. The interconnect layer 36 is deposited using conventional processing techniques e.g. by sputter deposition. In accordance with a preferred aspect of the present invention, a capping layer 38, for example of titanium, is deposited over the interconnect layer 36.

Typically, the capping layer 38 has a thickness of around 500 Angstroms.

The technical advantages of the present invention will now be described.

In accordance with the present invention, reflow of an interlevel dielectric layer of doped $SiO_2$ and growth of a diffusion barrier oxide control layer is carried out in a single process step by a rapid thermal anneal in oxygen. Thus fellow and oxide growth can be achieved in a single operation which improves the efficiency of the fabrication process and also reduces the handling which is associated with two individual processes. Thus the method of the present invention can give increased yield and reduced fabrication costs compared to the prior art. The single process also provides better cleanliness which is essential when growing a thin oxide layer. Heretofore, thin oxide layers have tended to be grown in roller-sled furnaces which can lead to contamination of the oxide layer whereas in the present invention a robot handler can be employed directly to put a wafer into the rapid thermal processor and to remove it. The use of a rapid thermal processor can improve the wafer to wafer repeatability. It is well known that gas depletion effects and lack of temperature uniformity along the length of a conventional furnace tube can lead to differences in oxidation rates on wafers at various positions in the tube. The present invention employs a rapid thermal anneal which is carried out in a small chamber in which the reactive gas and the temperature can be more easily controlled and this gives improved uniformity of the oxide layer. The use of a rapid thermal anneal also gives precisely controlled reflow of the interlevel dielectric layer.

The method of the present invention can also provide the advantage that the thinning of the metal contact layer at the oxide step associated with the contact window is reduced and thus the reliability of the fabricated device can be improved. Since the interlevel dielectric layer has been reflowed prior to deposition of the titanium layer and the subsequent aluminium interconnect layer, and optionally the titanium capping layer, the contact profile of the contact opening is optimised which results in improved step cover at the edges of the contact region. The side wall angle of the contact hole is changed by the flow of the glass in the rapid thermal anneal step so as to produce a smooth rounded profile of the interlevel dielectric which subsequently reduces thinning of the sputtered metal interconnect in the contact. In other words, the optimised contact profile of the contact opening assists in deposition of metal at the edges of the contact region. This reduction in metal thinning at the oxide steps overcomes a major reliability hazard of the prior art which can result in increased current density leading to accelerated electromigration failure. Scanning electron micrographs through the cross-section of the metal-silicon contact region shows that the step coverage (i.e. the lack of metal thinning) achieved by the present invention is considerably improved when compared to the prior art furnace tube process. The step coverage for the tube process was around 30% whereas that for the rapid thermal anneal process of the present invention was around 50%.

The present invention can also significantly improve the diffusion barrier performance of the metallurgic barrier layer of titanium nitride. The optimisation of the contact profile by choice of the conditions used for the combined reflow and pre-barrier oxide growth results in a superior diffusion barrier than that of the prior art. The improved step coverage of the titanium used to form the titanium nitride metallurgic barrier reduces the chance of barrier failure. Furthermore, the improved step coverage of the aluminium alloy of the subsequently-deposited interconnect layer reduces the ratio of unreacted titanium to aluminium alloy in the contact region hence removing the mechanism for enhanced aluminium and silicon interdiffusion which can lead to breakdown of the barrier. Barrier performance was judged by counting the number of contact regions which show dissollution of silicon by the metal, resulting in what are known as "spikes", after a high temperature anneal, such as at a temperature of 475° C. for 1 hour. An experiment was carried out to compare the barrier performance of devices fabricated in accordance with the present invention and devices fabricated employing the known processs in which oxide is formed in a furnace tube. In the known furnace tube process, the density (per 10,000 contacts examined) of spikes on P+ contacts was found to be around 2,000 whereas in accordance with the present invention the corresponding number of spikes was around 150. This demonstrates that improved step coverage which follows directly from the use of the combined fellow and barrier oxide growth produces an improved diffusion barrier which reduces the spiking phenomenon.

The present invention also can provide a reduction in the difference in the oxidation rates between N+ and P+ doped regions. In the known furnace tube oxidation process, it was found that the oxidation rates between the N+ and P+ doped regions differ substantially with the oxidation rate of the N+ regions being greater than that of the P+ regions. It has been found that the process of the present invention employing a rapid thermal anneal process to form the oxide control layer resulted in a significant reduction in the difference in oxide thickness grown on N+ regions compared to P+ regions ($\Delta_{n-p}$) when compared to the corresponding difference in oxides produced in a furnace tube. For a nominal oxide thickness of around 30 Angstroms on an N+ region, the furnace tube process gave $\Delta_{n-p}$ of around 100% whereas the rapid thermal anneal process of the present invention gave $\Delta_{n-p}$ of around 50%. Thus the process of the present invention can provide a significant reduction in the difference in the oxide thicknesses which provides improved device reliability and performance.

The method of the present invention can also provide that an acceptable metallurgic diffusion barrier can be fabricated while maintaining low metal to N+ and P+ doped silicon contact resistance by control of the diffusion barrier oxide. As discussed above, for a nominal oxide thickness of around 30 Angstroms on N+ regions the oxide thickness on the P+ regions are significantly different. The metallurgic barrier process relies on the whole or partial consumption during the nitridation process of the oxide control layer grown in the contact region. If the oxide is not sufficiently consumed during the nitridation process a high metal-silicon contact resistance will result and this is clearly undesirable. If the oxide control layer is too thick in the resultant semiconductor device, this leads to an undesirable high contact resistance which reduces device performance and reliability. In accordance with the present invention, the rapid thermal anneal process which is employed to grow the oxide control layer gives improved control over the thickness of the oxide control layer. The thickness of the oxide control layers is more uniform in the sense that not only is the actual thickness easier to control but also the variation between the different oxide control layers is considerably reduced. In accordance with the present invention, the thickness of the oxide control layer was found to vary between different oxide control layers by ±5% or less to give a contact resistance for a metal/p-doped single crystal silicon contact of around 100 ohms. In contrast, in the known furnace tube process the oxide thickness was ±8 to 10% providing a contact resistance for a similar contact of up to around 200 ohms. In experiments conducted to examine the differences in contact resistance between the known furnace tube process and the rapid thermal anneal process employed in the present invention, it was found that lower contact resistance values and a tighter distribution of those values was obtained using the rapid thermal anneal process. In a particular experiment, the average contact resistance of a metal/doped polysilicon contact made by the known furnace tube process was found to be 41.0 ohms/contact ($\sigma=6.0$) whereas the rapid thermal anneal process was found to give, for an equivalent contact, a contact resistance of 12.0 ohms/contact ($\sigma=1.0$).

This greater control over the thickness of the oxide layer is also important in relation to the spiking phenomenon which occurs in the prior art. If the oxide control layer is too thin, the control layer can fail to prevent interdiffusion of aluminium and silicon at the contact region during temperature cycles used in the fabrication and the assembly processes. This interdiffusion can result in the formation of electrically conductive aluminium silicon spikes which extend downwardly from the aluminium interconnect layer into the silicon substrate and cause failure of the contact due to unacceptably high junction leakage. Thus the control of the thickness of the oxide control layer is a major advantage of the present invention.

in a preferred aspect of the present invention the aluminium interconnect layer is capped by a titanium capping layer. In the prior art it is known that a titanium cap can react with aluminium and silicon to form a ternary compound ($Al_xSi_yTi_z$) which has a large affinity for silicon and the formation of this compound can leave a silicon doped aluminium alloy deficient of silicon. In accordance with the present invention, since the aluminium interconnect and the titanium capping layer are successively deposited over a reflowed interlevel dielectric layer, there is improved step coverage of the aluminium alloy which reduces the ratio of unreacted titanium to aluminium alloy in the contact region thus removing the mechanism for enhanced aluminium and silicon interdiffusion. It is known that the step coverage of a deposited metal film is affected by the contact window size and shape. Accordingly, if the titanium nitride barrier layer is thin due to poor step coverage, local defects can occur which cause the barrier to fail. Once the diffusion barrier has failed the rate at which the aluminium and silicon interdiffusion occurs is enhanced by the presence of unreacted titanium, such as that present in the capping layer. If the contact profile and thus the alloy step coverage is improved the relative amount of titanium to aluminium alloy is decreased and this consequently decelerates the interdiffusion of aluminium and silicon when a capped aluminium alloy is used, even on a non-optimised contact after the barrier layer has failed.

What we claim is:

1. A method of fabricating an electrical contact in a semiconductor device, the method comprising the steps of:
   providing on an underlying silicon substrate a reflowable interlevel dielectric material having a contact opening exposing a contact region of the silicon substrate;
   heating the silicon substrate and the interlevel dielectric material by a rapid thermal anneal in an oxygen-containing atmosphere thereby to grow an oxide control layer in the contact region and to reflow the dielectric material simultaneously, in a single step ;
   depositing a layer of transition metal over the reflowed dielectric material and the control layer; and
   converting at least part of the transition metal layer into a metallurgic barrier.

2. A method according to claim 1 further comprising the steps of depositing an interconnect layer including aluminium over the metallurgic barrier and depositing a capping metal layer over the interconnect layer.

3. A method according to claim 2 wherein the capping metal layer comprises titanium.

4. A method according to claim 1, wherein the reflowable dielectric material comprises a boron phosphorous silicon glass.

5. A method according to claim 1 wherein the layer of transition metal comprises titanium.

6. A method according to claim 5 wherein the metallurgic barrier comprises titanium nitride and is formed by nitridation of the layer of titanium.

7. A method of fabricating an electrical contact in a semiconductor device, the method comprising the steps of:
   providing on an underlying silicon substrate a reflowable interlevel dielectric material having a contact opening exposing a contact region of the silicon substrate;
   heating the silicon substrate and the interlevel dielectric material by a rapid thermal anneal at a temperature of 950° to 1050° C. in an oxygen-containing atmosphere thereby to grow an oxide control layer in the contact region and to reflow the dielectric material simultaneously, in a single step;
   depositing a layer of transition metal over the reflowed dielectric material and the control layer; and
   converting at least part of the transition metal layer into a metallurgic barrier.

8. A method according to claim 7 further comprising the steps of depositing an interconnect layer including aluminum over the metallurgic barrier and depositing a capping metal layer over the interconnect layer.

9. A method according to claim 8 wherein the capping metal layer comprises titanium.

10. A method according to claim 7 wherein the reflowable dielectric material comprises a boron phosphorus silicon glass.

11. A method according to claim 7 wherein the layer of transition metal comprises titanium.

12. A method according to claim 11 wherein the metallurgic barrier comprises titanium nitride and is formed by nitridation of the layer of titanium.

* * * * *